United States Patent [19]

Dyck et al.

[11] Patent Number: 4,593,303
[45] Date of Patent: Jun. 3, 1986

[54] SELF-ALIGNED ANTIBLOOMING STRUCTURE FOR CHARGE-COUPLED DEVICES

[75] Inventors: Rudolph H. Dyck; James M. Early, both of Palo Alto, Calif.

[73] Assignee: Fairchild Camera & Instrument Corporation, Sunnyvale, Calif.

[21] Appl. No.: 758,563

[22] Filed: Jul. 23, 1985

Related U.S. Application Data

[63] Continuation of Ser. No. 589,844, Mar. 15, 1984, which is a continuation of Ser. No. 282,198, Jul. 10, 1981.

[51] Int. Cl.[4] ............... H01L 29/78; H01L 27/14; H01L 31/00
[52] U.S. Cl. .................................. 357/24; 357/30
[58] Field of Search .................. 357/24 M, 24 LR, 30

[56] References Cited

U.S. PATENT DOCUMENTS

| | | | |
|---|---|---|---|
| 3,863,065 | 1/1975 | Kosonocky et al. | 357/24 LR |
| 3,866,067 | 2/1975 | Amelio | 357/24 LR |
| 4,012,587 | 3/1977 | Ochi et al. | 357/24 LR |
| 4,028,716 | 6/1977 | van Santen et al. | 357/24 LR |
| 4,064,532 | 12/1977 | Yamanaka | 357/24 LR |
| 4,173,064 | 11/1979 | Farnow | 357/24 LR |
| 4,229,752 | 10/1980 | Hynecek | 357/24 M |
| 4,236,168 | 11/1980 | Herbst | 357/24 LR |
| 4,362,575 | 12/1982 | Wallace | 357/24 M |
| 4,396,438 | 8/1983 | Goodman | 357/24 M |

OTHER PUBLICATIONS

Sequin et al, *Charge Transfer Devices*, Academic Press, N.Y. 1975, pp. 11–13, 152–157, 178–183.

Primary Examiner—Gene M. Munson
Attorney, Agent, or Firm—Dale Gaudier

[57] ABSTRACT

A self-aligned element antiblooming structure for application to charge-coupled devices includes a region in the substrate in which the charge-coupled device is fabricated into which both a P and N conductivity type impurity are introduced. By introducing impurities of different diffusivities, a sink region is created between two very narrow antiblooming barriers. Using appropriate process controls, the potential height of the antiblooming barriers may be adjusted to drain excess charge accumulating in the substrate adjacent the antiblooming barriers. In this manner the antiblooming function is accomplished using only a minimal area of the substrate. The invention is applicable to charge-coupled devices utilizing a variety of different clocking schemes, and to charge-coupled device image sensors using buried channels.

11 Claims, 19 Drawing Figures

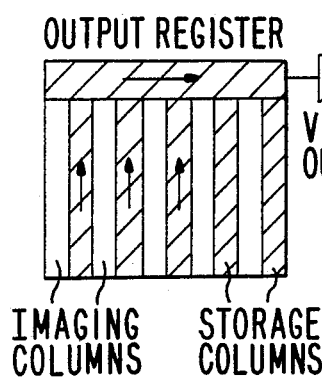
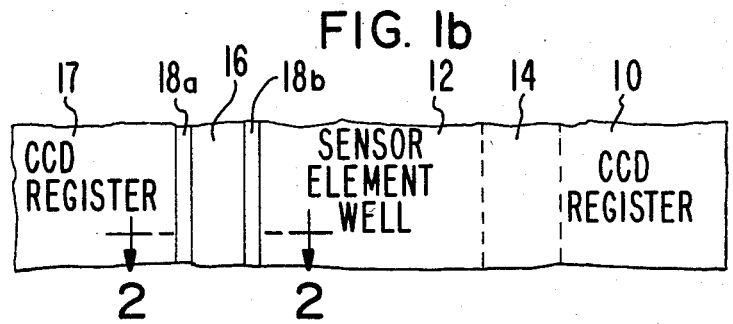
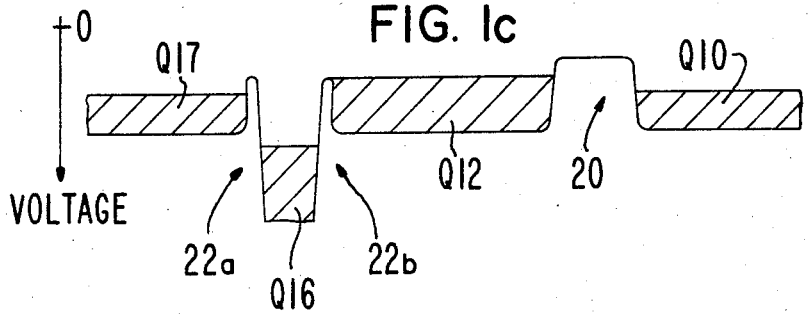
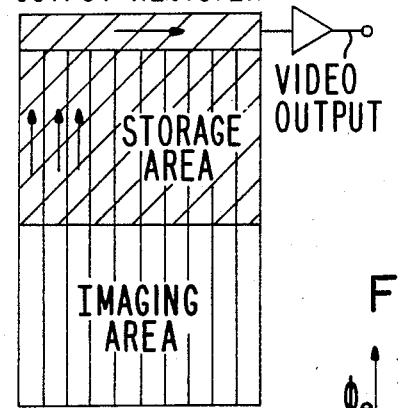
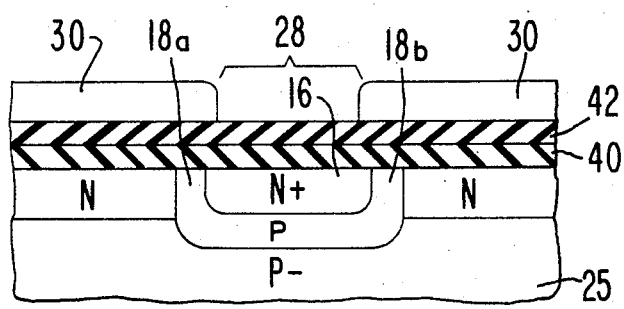
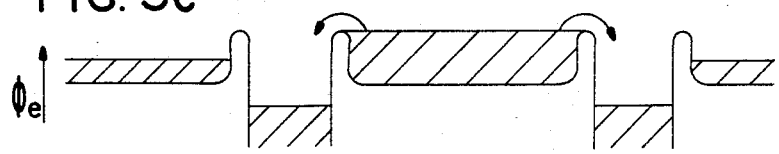
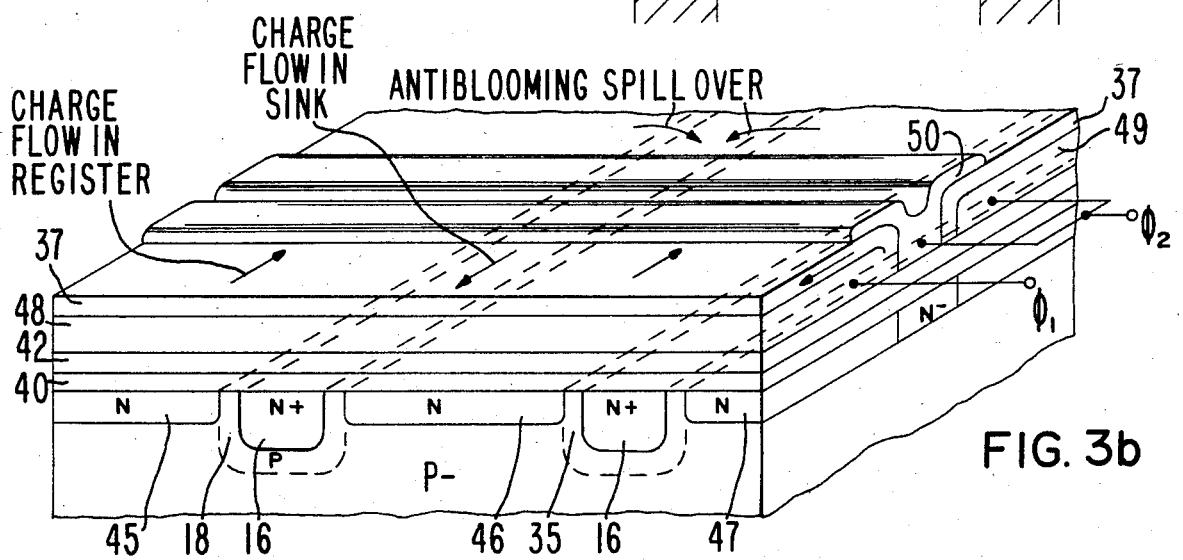

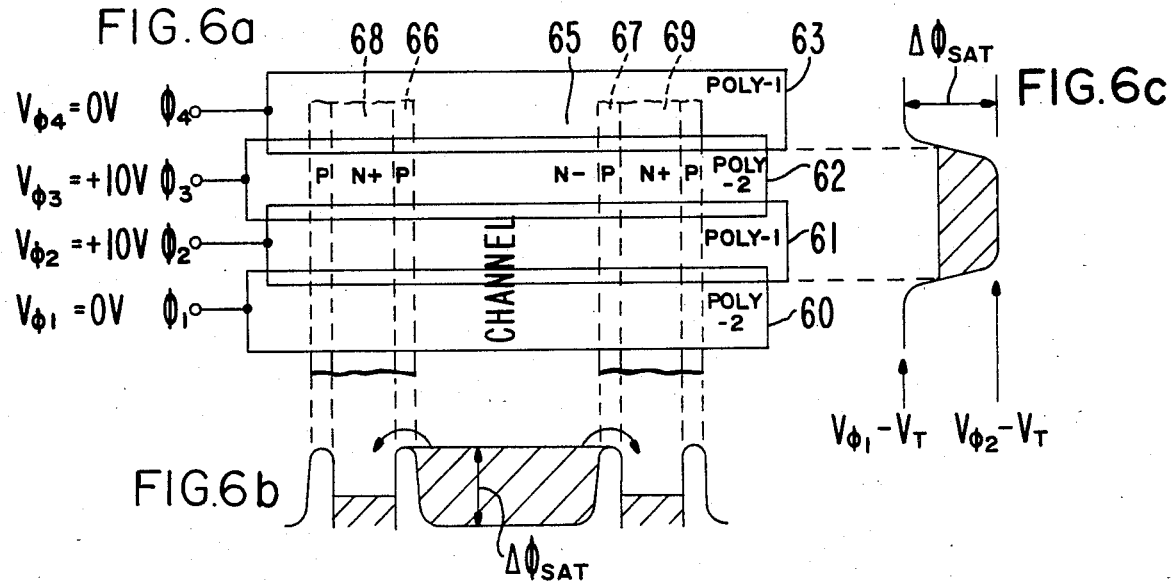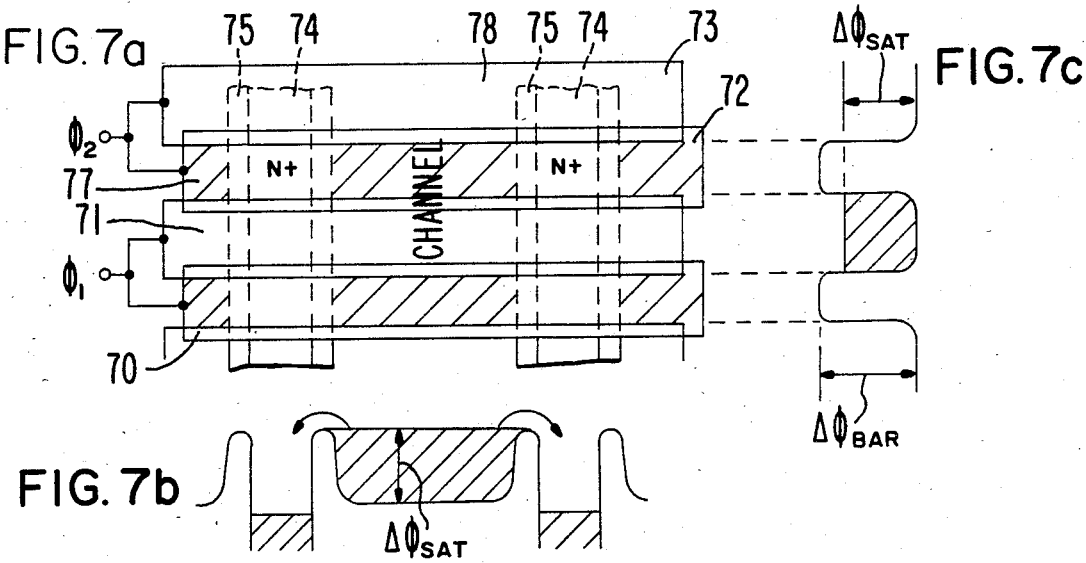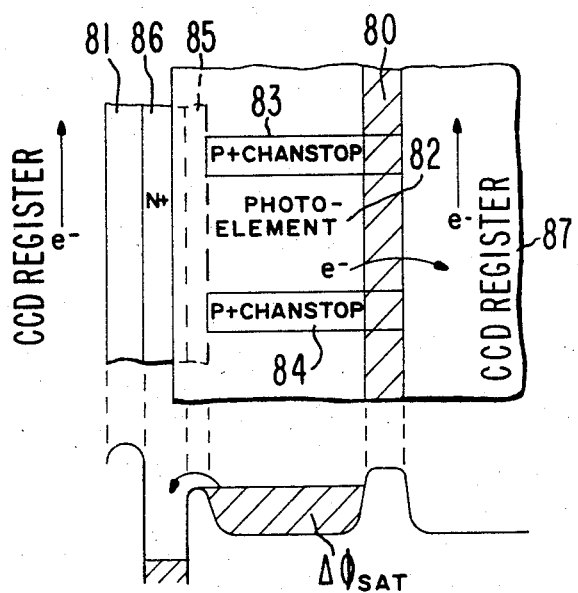

SELF-ALIGNED ANTIBLOOMING STRUCTURE FOR CHARGE-COUPLED DEVICES

This invention was made with Government support under Contract No. N00039-78-C-0076. The Government has certain rights in this invention.

REFERENCE TO RELATED APPLICATION

This is a continuation of application Ser. No. 589,844, filed Mar. 15, 1984, now abandoned and a continuation of U.S. patent application Ser. No. 06/282,198, filed July 10, 1981, now abandoned.

BACKGROUND OF THE INVENTION

1. Field of the Invention

This invention relates to integrated circuit structures and in particular to a self-aligned antiblooming structure for individual elements of a charge-coupled device image sensor.

2. Description of the Prior Art

The phenomenon in charge-coupled device (CCD) image sensors in which excess signal charge from saturated sensor elements spills into adjacent sensor elements or shift registers is known as blooming. When this excess charge spills into an adjacent shift register, it generally mixes with the signal charge from a large number of pixels, thereby causing a particularly objectionable type of blooming. This type of blooming produces a vertical streak in the image wherever a saturated pixel occurs.

Structures in image sensors which prevent or limit blooming are known as antiblooming structures. The most complete blooming prevention requires an antiblooming structure at each sensor element so that the individual elements cannot bloom. This function has been referred to as element antiblooming to distinguish it from the much less effective prior art column antiblooming function which limits blooming to the vertical column in which the saturated element occurs.

SUMMARY OF THE INVENTION

The self-aligned element antiblooming structure of this invention provides several important advantages over prior art structures. There need not be any increase in the combined photoelement well/antiblooming structure size over charge-coupled devices not employing element antiblooming designs. In addition, the element antiblooming structure of this invention involves minimal processing complication in the manufacture of the charge-coupled device.

The self-aligned element antiblooming structure of this invention is created by modifying the fabrication process for a CCD area imaging device at the step at which the channel stop is fabricated. In the unmodified prior art process the channel stop is made by introducing, typically by ion implantation, a P conductivity type impurity through a columnar pattern of openings in a layer of photoresist. According to the invention the same arrangement of openings in the photoresist is used, but a unique series of two implantations of impurities and a diffusion are utilized.

In the preferred embodiment, a first dose of N conductivity type impurity is implanted to function as a sink diode for excess charge. Next, a P type impurity is implanted into the N type region using the same mask. The mask is then removed and the P and N type impurities are diffused into the substrate. By choosing an N type impurity which has a substantially smaller diffusivity in silicon than does the P type impurity, the distribution of the N type impurity will remain relatively confined while the P type impurity will diffuse further into the structure. The result is that a narrow region of P type impurity is formed along the edges of the N type central region. Hence, a heavily doped N type region is defined at the channel stop location and isolated from adjacent channels by a diffused pair of lateral P type barriers.

In a preferred embodiment a charge coupled device fabricated in a semiconductor substrate includes photosensitive means for accumulating charge in response to ambient light; transfer means for transferring charge from the photosensitive means to such other location as desired; and antiblooming means for removing undesired charge from at least one of the photosensitive means and from the transfer means, the antiblooming means including regions in the substrate into each of which both a P and an N conductivity type impurity of significantly different diffusivity have been introduced.

By connecting the N type impurity to a potential source of appropriate level, the effective barrier height of the P type regions may be adjusted to be lower than that of the adjacent clocked registers. In this manner, signal charge in excess of the register saturation level, as well as the sensor element saturation level, will spill into the N type region rather than spill into adjacent signal containing wells.

BRIEF DESCRIPTION OF THE DRAWINGS

FIG. 1a is a schematic drawing of an interline transfer CCD.

FIG. 1b is a top view of a portion of an interline transfer charge-coupled imaging device fabricated with the self-aligned element antiblooming structure.

FIG. 1c is a schematic representation of the potential wells created by the structure of FIG. 1b.

FIG. 2 is an enlarged cross-sectional view of a portion of the structure shown in FIG. 1b.

FIG. 3a is a schematic drawing of a frame transfer charge-coupled device.

FIG. 3b is a perspective view of a frame transfer charge-coupled area imaging device utilizing the element antiblooming structure.

FIG. 3c is a diagram showing the potential wells created by the structure shown in FIG. 3b.

FIG. 6a is a top view of a portion of a four phase charge coupled area imaging device.

FIG. 6b is a schematic showing the potential well created in a cross-section of FIG. 6a.

FIG. 6c is a schematic showing a potential well created by the structure 6a in another cross-section.

FiG. 7a is a top view of a portion of a two-phase charge coupled device.

FIG. 7b is a schematic diagram showing the potential wells created in a first cross-section of the structure in FIG. 7a.

FIG. 7c is a schematic diagram of the potential wells created in a second cross-section of the structure shown in FIG. 7a.

FIG. 8a is a top view of a portion of an interline transfer charge-coupled device.

FIG. 8b is a schematic diagram of the potential wells created by the structure of FIG. 8a.

FIG. 9b is a schematic diagram of the potential wells created by the structure shown in FIG. 9a.

DESCRIPTION OF THE PREFERRED EMBODIMENTS

Figure 5:
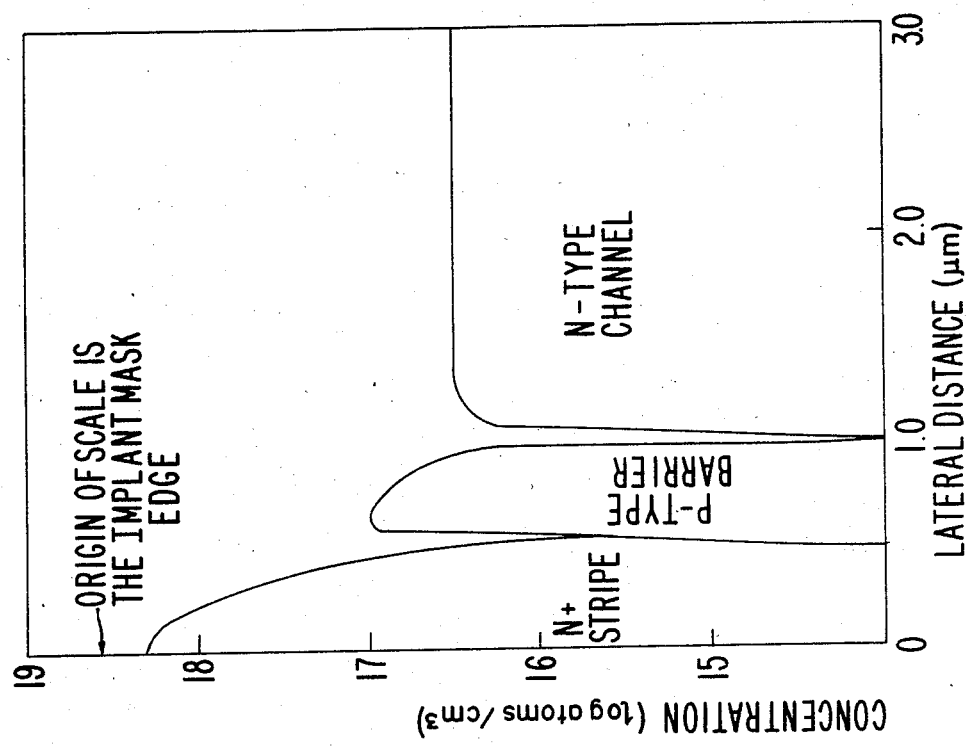
FIG. 5 is a graph showing the relationship between the concentration of the P and N type impurities as related to the lateral distance from the edge of the implant mask.

FIG. 1a is a schematic view of an interline transfer charge coupled device. In a known manner charge is accumulated in the imaging columns, transferred to the storage columns and then supplied to the video output by the output register. FIG. 1b is an enlarged top view of a portion of FIG. 1a illustrating a buried channel interline transfer charge-coupled device employing the element anti-blooming structure of this invention. The structure depicted includes a charge-coupled device shift register or storage column 10 and a sensor element well 12 separated by a transfer gate 14. In operation ambient light striking the surface of sensor element well 12 causes the accumulation of electrons in the underlying substrate. After a desired interval, the potential of transfer gate 14 is changed to permit the accumulated charge from well 12 to flow into register 10. Register 10 then transfers the accumulated charge to a charge detector or to another shift register. The self-aligned element antiblooming structure of this invention is formed adjacent the other side of sensor element well 12 from register 10. As shown in FIG. 1b a charge sink 6 has antiblooming barriers 18a and 18b disposed on each side. As will be explained, the antiblooming barriers 18a 18b provide a slightly lower barrier height than does the transfer gate 14.

FIG. 1c is a schematic diagram of the potential barriers and accumulated charge created by the structure shown in FIG. 1b. As shown in FIG. 1c transfer gate 14 creates a potential barrier 20 while antiblooming barriers 18a and 18b create potential barriers 22a and 22b, respectively. The charge accumulating in sensor element well 12 is designated Q12, while the charge collected in register 10 and in register 17 is designated Q10 and Q17, respectively. Charge in sink 16 is shown as Q16. As shown in FIG. 1c, the antiblooming barriers 18a and 18b are fabricated to create barriers 22a and 22b having potential heights which are slightly lower than the potential height of transfer gate 14 separating well 12 from register 10. In this manner any charge in excess of the amount Q12 permitted by barrier 18b will drain into sink 16 where it may be harmlessly conducted away. The charge level in the individual elements of registers 10 and 17 depicted in FIG. 1b may be maintained at a lower level than the potential weight of the antiblooming barriers 18a and 18b by fabricating the elements of the CCD register 10 or 17 to be larger than the maximum amount of charge, for example Q12, which may accumulate in any individual photoelement well.

FIG. 2 is an enlarged cross-sectional view taken through the structure of FIG. 1b. As shown in FIG. 2 the sink 16 and the antiblooming barriers 18a and 18b are created by regions of impurity introduced into substrate 25. Sink 16 comprises a strongly doped N conductivity type region, which in the preferred embodiment is created by implanting arsenic ions into the silicon substrate 25. Antiblooming barriers 18a and 18b, which are each portions of a single P conductivity type region 18, are created by implanting boron ions into substrate 25. Both the boron and the arsenic ions are introduced through an opening 28 in a layer of photoresist 30. The doses of impurity dopants and resulting concentration profiles are discussed in conjunction with FIGS. 4 and 5 below. The volume of the silicon substrate 25 that is lost with respect to useful photoresponse as a result of fabricating the sink 16 and antiblooming barriers 18 is less than that of the doped regions 16 and 18 themselves. As known in charge-coupled device fabrication technology, a layer of silicon dioxide 40 and an overlying layer of silicon nitride 42 may be formed on the surface of silicon 25 before photoresist layer 30 is formed.

FIG. 3a is a schematic diagram of a known frame transfer charge coupled device. As illustrated charge is accumulated in an imaging area, then transferred sequentially to a storage area and to a video output terminal via an output register. A perspective view of the self-aligned element antiblooming structure of this invention as applied to the photosensitive imaging area of a frame transfer device is shown in FIG. 3b, with gate electrodes 48, 49 and 50 in place. The self-aligned element antiblooming portion of the structure shown in FIG. 3b is fabricated in the same manner as discussed in conjunction with FIG. 2. The remainder of the structure is fabricated using known CCD fabrication technology. These processes are briefly discussed below.

The structure shown in FIG. 3b generates a potential configuration which is shown in FIG. 3c. By contacting the N conductivity type stripe 16 externally, the barrier height in the adjoining P type region 18 may be adjusted to be lower than that of the adjacent clocked barrier. As discussed in conjunction with FIG. 2 this will cause signal charge in excess of the register saturation level to spill into the N type stripe 16. The minimum width necessary to obtain the desired antiblooming barrier potential is determined by the breakdown voltage of the junction between the N type stripe 16 and the P type barrier 18. A dose of arsenic ions on the order of $3 \times 10^{13}$ ions per cm$^2$ is first implanted into the substrate through implant windows in the overlying photoresist at desired locations. The arsenic dopant creates a series of sink regions 16 as shown in FIG. 3b. Next a dose of boron ions on the order of $2 \times 10^{13}$ ions per cm$^2$ are implanted into the now arsenic doped region using the same implant windows in the photoresist mask. The photoresist is removed and the implants are diffused into the substrate at a high temperature. A suitable procedure is to hold temperature the order of 1100° C. for 60 to 240 minutes. Because boron diffuses approximately 2.5 times faster in silicon than does arsenic at 1100° C., the distribution of arsenic 16 will remain relatively confined while the boron will diffuse outward approximately 1 micrometer to form antiblooming barriers 18 and 35 as shown in FIGS. 2 and 3b. In the embodiment depicted in FIG. 3b, substrate 25 will also include a series of registers 45, 46 and 47 in which the silicon substrate has been doped with N type impurity to a concentration of $10^{16}$ atoms per cubic centimeter. The width of the P type barrier region 18 may be adjusted by altering the length of the diffusion time after implanting both the arsenic and boron ions. The P barrier will be approximately one micron wide for a diffusion lasting 200 minutes. Of course, the boron implant energy may be increased to cause lateral scattering of the boron ions and thereby reduce the duration of the diffusion.

The structure of FIG. 3b may be completed using conventional charge-coupled device fabrication techniques. After the antiblooming barrier and sink are diffused, buried channel implants 45 and 46 are performed. Then a sequence of polycrystalline electrodes 48, 49 etc. may be formed across the surface of silicon nitride 42 separated by silicon dioxide 37. For a two-phase charge-coupled device, alternate pairs of electrodes will be connected to a first phase clock signal while the remaining electrodes 49 and 50 will be connected to an opposite clock signal. The resulting structure includes a heavily doped N conductivity type register which is isolated from adjacent registers by a diffused pair of lateral P conductivity type barriers 18 and 35.

Figure 4:
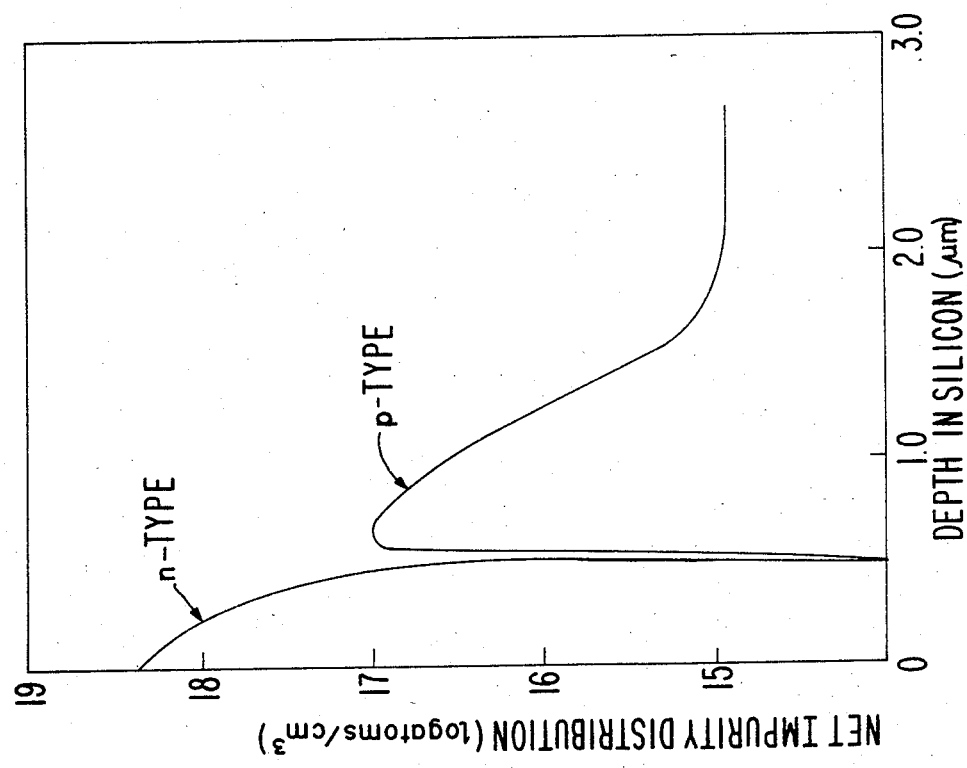
FIG. 4 is a graph showing typical N and P type impurity concentrations as a function of depth in the silicon substrate for the structure shown in FIG. 2.

FIG. 4 shows the estimated impurity distribution of the element antiblooming barriers shown in FIGS. 2 and 3b as a function of depth in substrate 25. The distribution depicted is for an arsenic implant of $6 \times 10^{13}$ ions per square centimeter, a boron implant of $2 \times 10^{13}$ ions per square centimeter and for 45 minute diffusion at 1100° C.

FIG. 5 shows the impurity concentrations of the element antiblooming barrier as a function of the lateral distance from the edge of the implant window in the photoresist mask. This is the edge, for example, of photoresist 30 in FIG. 2. FIG. 5 assumes an arsenic implant of $3 \times 10^{13}$ atoms per square centimeter and a boron implant of $1.5 \times 10^{13}$ atoms per square centimeter.

FIGS. 6 through 9 illustrate other applications of the self-aligned element antiblooming barrier of this invention in addition to those discussed above. FIG. 6a shows application of the antiblooming barrier to a four-phase charge-coupled device. The application depicted is also appropriate for a three-phase charge-coupled device. As shown in FIG. 6a a four-phase charge-coupled device includes overlapping, but electrically separate, polycrystalline silicon electrodes 60, 61, 62 and 63. Each electrode is connected to one phase of a four phase clock signal. In a device such as the one depicted the packets of accumulated charge move forward along the channel 65 at essentially one potential determined by the high clock voltage. In the preferred mode of operation considered here, either two or three phases are high at any one time. Therefore, the antiblooming barrier may be fixed at one potential at all points along the channel during the portion of each clock cycle that is active. As shown in FIGS. 6b and 6c, excess charge from the channel will overflow barriers 66 and 67 into the sinks 68 and 69 when two adjoining electrodes are clocked high. The process determines the saturation charge of the structure.

FIGS. 7a, 7b, and 7c, illustrate the application of the element antiblooming structure of this invention to a two-phase charge-coupled device. In FIG. 7a electrodes 70 and 71 are connected to the $\phi_1$ clock signal and electrodes 72 and 73 connected to the $\phi_2$ clock signal. The arsenic and boron implants comprising the sink and antiblooming barriers are designated 74 and 75, respectively. The barriers across the channel are cross-hatched and designated 76 and 77, respectively. Because of built-in barriers in a two-phase charged-coupled device, the bottom of each potential well must be raised over the periodic barriers to move the charge packets forward along the channel. Element antiblooming protection may best be achieved in a two-phase CCD if the clocks are operated in a non-overlapping mode in which both clocks signals are simultaneously low for at least a very short time during each cycle. For this short time, on the order of tens of nanoseconds, FIGS. 7b and 7c illustrate the operation of the antiblooming barriers.

As shown in FIG. 7b and 7c the antiblooming barriers 75 will drain away excess charge from the channel into the sink 74 when the charge packets are accumulated under a single electrode—electrode 71, shown in FIG. 7a. Because the potential height of barriers 76 and 77 is greater than that of the antiblooming barrier 75, the excess charge in channel 78 will overflow into sink 74 rather than over the leading barrier 77 or the trailing barrier 76.

FIGS. 8a and 8b illustrate application of the element antiblooming barrier to an interline transfer television type of charge-coupled device array. In this application the antiblooming barriers are positioned only at the photoelement sites, and not at the CCD register. As shown in FIG. 8a a cell of an interline transfer device includes a photoelement barrier 80, a channel stop disposed along one side of the photoelement 82, together with channel stops 83 and 84 positioned perpendicular to the CCD register. The antiblooming barrier 85 and the N type sink 86 separate photoelement 82 from channel stop 81. In operation charge is accumulated in photoelement 82 and then transferred to CCD register 87 at desired intervals. As shown by FIG. 8b, the preferred mode of operation of the antiblooming barrier in an interline transfer device is with the photogate 89 biased low most of the operating cycle. In this mode excess charge flows over barrier 85 into sink 86. The charge is precluded from flowing into CCD register 87 by photoelement barrier 80. This apparatus is similar in operation to the two-phase apparatus discussed in conjunction with FIGS. 3a and 3b.

Figure 9B:
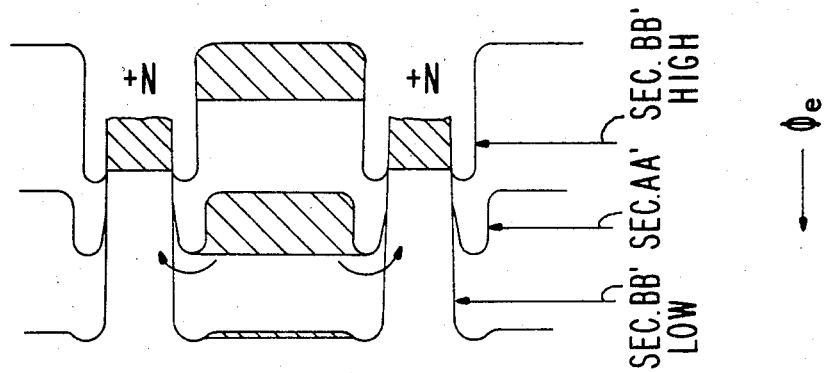
Figure 9A:
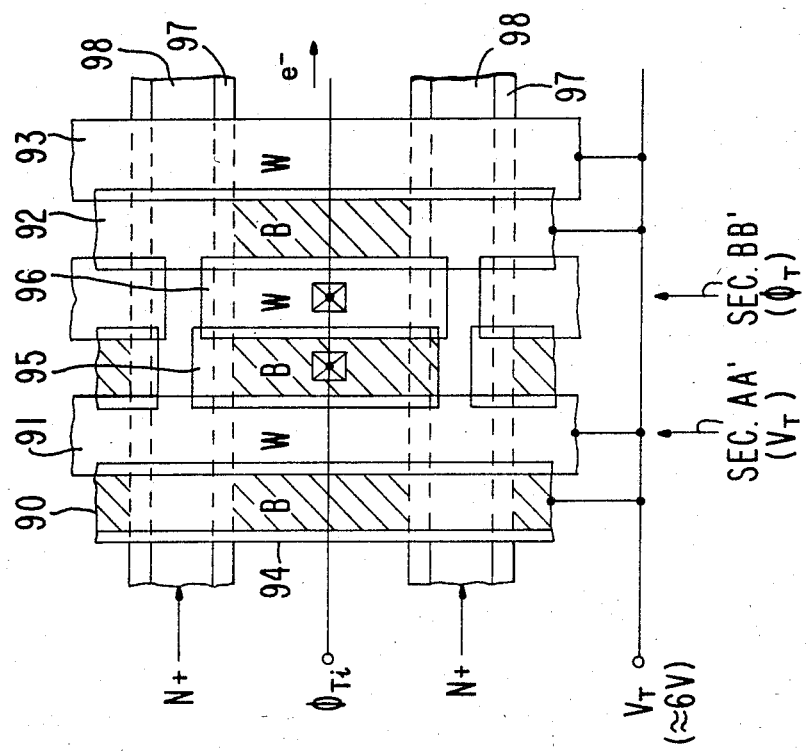
FIG. 9a is a top view of a portion of a 1½ phase charge-coupled device.

An application of the element antiblooming structure to a 1½ phase charge-coupled device is shown in FIGS. 9a and 9b as it might be used in an area imaging device of the line-by-line type. A 1½ phase CCD register is identical to a two-phase register in design; however, the application of clock signals is different. In a 1½ phase CCD register, a single clock of twice the amplitude is used. Because of the high amplitude, barrier modulation must be reduced to prevent charge from spilling back into the register from the adjoining sink. As shown in FIG. 9a, a series of electrodes 90, 91, 92 and 93 are disposed over a channel 94. These electrodes are connected to a desired potential, typically on the order of 6 volts. Electrodes 95 and 96 are disposed along the same channel and connected to a signal $\phi_T$ as shown. In the same manner as previously described, antiblooming barriers 97 and sinks 98 are disposed adjacent the length of channel 94.

FIG. 9b illustrates the operation of the anti-blooming barriers as charge packets are transferred along channel 94. The antiblooming barrier is fabricated so as to be of the desired height in the dc phase $V_T$. Because of the inherent properties of such narrow channels, the barrier will be too high or too low in the clocked phase $\phi_T$, depending upon the bias state of that clock. As a result, the desired antiblooming barrier function is achieved whenever clock $\phi_T$ is low.

The antiblooming barrier of this invention may also be applied to other types of charge-coupled devices. For example, in types with photodiode sense elements a gate electrode to control the surface potential is impractical. The invention, however, permits such a narrow barrier, on the order of less than one micrometer, that the potential of the barrier region may be controlled simply by the potentials of adjacent regions, that is, the N type sink and the photodiode reset potential. The antiblooming barrier may also be applied to other signal processing devices.

The foregoing explanation of the preferred embodiments of this invention is intended to be illustrative of the invention rather than as limiting it. The scope of the invention may be more readily ascertained with reference to the appended claims.

What is claimed is:

1. An integrated circuit structure comprising:
   a semiconductor substrate of first conductivity type, the substrate including a charge-containing region of opposite conductivity type for containing charge and from which charge in excess of a selected amount is to be removed;
   a barrier region of first conductivity type more strongly doped than the substrate, the barrier region disposed in the substrate disposed adjacent the charge-containing region and extending into the substrate to a first depth for allowing charge in excess of a selected amount to pass through the barrier region; and
   a charge sink region of opposite conductivity type disposed wholly within the barrier region for draining charge passing through that portion of the barrier region between the charge sink region and the charge-containing region, the charge sink region extending into the substrate a second depth less than the first depth and being separated from both the charge-containing region and the substrate by the barrier region.

2. A structure as in claim 1 wherein the first conductivity type impurity comprises boron and the opposite conductivity type impurity comprises arsenic.

3. A structure as in claim 1 wherein the charge-containing region comprises a sensor element in a charge-coupled device.

4. A structure as in claim 3 wherein charge accumulates in the sensor element in response to incident light.

5. A structure as in claim 1 wherein the charge-containing region comprises a shift register region beneath an electrode in a charge-coupled device.

6. A structure as in claim 5 wherein a plurality of shift register regions are sequentially arranged.

7. A structure as in claim 6 wherein the barrier region is disposed along an edge of the plurality of shift register regions.

8. A structure as in claim 1 wherein the first conductivity type impurity and the opposite conductivity type impurity have different diffusion coefficients in the substrate.

9. A structure as defined in claim 8 wherein the first conductivity type is P type and the opposite conductivity type is N type.

10. A structure as defined in claim 8 wherein said first conductivity type impurity has a higher diffusion coefficient than said opposite conductivity type impurity.

11. In a charge-coupled device fabricated in a semiconductor substrate including photosensitive means for accumulating charge in response to ambient light and transfer means for transferring charge from the photosensitive means to another location in the substrate, antiblooming means for removing undesired charge from at least one of the photosensitive means and the transfer means, the antiblooming means comprising:
    a barrier region of first conductivity type impurity in the substrate more strongly doped than the substrate and extending into the substrate to a first depth, disposed adjacent at least one of the photosensitive means and the transfer means for allowing undesired charge to pass through the barrier region; and
    a charge sink region of opposite conductivity type diposed wholly within the barrier region for draining charge passing through that portion of the barrier region disposed between the charge sink region and the at least one of the photosensitive means and transfer means, the charge sink region extending into the substrate a second depth less than the first depth and being separated from both the substrate and the at least one of the photosensitive means and transfer means by the barrier region.

* * * * *